(12) United States Patent
Ryu

(10) Patent No.: US 6,784,709 B2
(45) Date of Patent: Aug. 31, 2004

(54) CLOCK GENERATOR TO CONTROL A PULES WIDTH ACCORDING TO INPUT VOLTAGE LEVEL IN SEMICONDUCTOR MEMORY DEVICE

(75) Inventor: Je-Hun Ryu, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/198,954

(22) Filed: Jul. 22, 2002

(65) Prior Publication Data

US 2003/0085748 A1 May 8, 2003

(30) Foreign Application Priority Data

Nov. 2, 2001 (KR) .................................. 10-2001-68132

(51) Int. Cl.[7] .............................................. H03K 3/017
(52) U.S. Cl. ....................... 327/172; 327/291; 327/298
(58) Field of Search ................................ 327/291, 292, 327/293, 294, 297, 298, 105, 113, 114, 141, 144, 154, 155, 162, 164, 172–175; 331/1 R, 18, 1 A, 55; 365/233, 233.05

(56) References Cited

U.S. PATENT DOCUMENTS

| | | | |
|---|---|---|---|
| 4,767,947 A | * 8/1988 | Shah | .......................... 327/176 |
| 5,130,582 A | 7/1992 | Ishihara et al. | |
| 5,723,995 A | 3/1998 | Mozdzen et al. | |
| 5,808,961 A | * 9/1998 | Sawada | ...................... 365/233 |
| 5,886,586 A | * 3/1999 | Lai et al. | ..................... 332/109 |
| 5,898,331 A | * 4/1999 | Fujita | .......................... 327/296 |
| 5,911,229 A | 6/1999 | Chodorow | |
| 5,914,622 A | * 6/1999 | Inoue | .......................... 327/172 |
| 5,953,286 A | * 9/1999 | Matsubara et al. | ......... 365/233 |
| 6,031,786 A | 2/2000 | Jang et al. | |
| 6,064,230 A | 5/2000 | Singh | |
| 6,075,749 A | * 6/2000 | Isa | .............................. 365/233 |
| 6,107,850 A | * 8/2000 | Shimizu | ...................... 327/172 |
| 6,144,614 A | 11/2000 | Kanda et al. | |
| 6,144,617 A | * 11/2000 | Takai | ....................... 365/233.5 |
| 6,154,415 A | 11/2000 | Jeong | |
| 6,295,238 B1 | * 9/2001 | Tanizaki et al. | ............. 365/201 |
| 6,489,819 B1 | * 12/2002 | Kono et al. | .................. 327/141 |

FOREIGN PATENT DOCUMENTS

| | | | | |
|---|---|---|---|---|
| JP | 04-363061 | 12/1992 | ......... | H01L/27/108 |
| JP | 07-176187 | 7/1995 | ......... | G11C/11/407 |
| JP | 07-312008 | 11/1995 | ......... | G11C/11/413 |

* cited by examiner

*Primary Examiner*—Timothy P. Callahan
*Assistant Examiner*—Hai L. Nguyen
(74) *Attorney, Agent, or Firm*—Jacobson Holman PLLC

(57) ABSTRACT

A clock generator to produce internal clock signals with a controlled pulse width in a synchronous semiconductor memory device. The clock generator includes a clock input circuit receiving an external clock signal, a reference voltage signal and an option signal, and outputting first and second clock signals; a clock driver receiving the first clock signal and outputting an internal clock signal in response to the option signal; and a detector receiving the second clock signal and outputting the option signal in response to a control signal.

17 Claims, 10 Drawing Sheets

CLOCK GENERATOR TO CONTROL A PULES WIDTH ACCORDING TO INPUT VOLTAGE LEVEL IN SEMICONDUCTOR MEMORY DEVICE

FIELD OF THE INVENTION

The present invention relates to a semiconductor memory device and, more particularly, to a clock generator to produce internal clock signals with a controlled pulse width in a synchronous semiconductor memory device.

DESCRIPTION OF THE RELATED ARTS

To increase the operation speed of highly integrated semiconductor memory devices, synchronous memory devices, which are synchronized with system clock signals from a memory controller, have been developed.

Read and write operations of asynchronous semiconductor memory devices are performed in response to row address strobe and column address strobe signals without a system clock signal while the synchronous semiconductor memory devices are synchronized with the fast clock signal from the memory controller. Accordingly, the operation speed of the synchronous semiconductor memory device is typically faster than that of the asynchronous semiconductor memory device. Moreover, in the high-speed central processing unit (CPU), the synchronous semiconductor memory devices, such as double data rate (DDR) SDRAMs and Rambus DRAMs, have been proposed as next generation memory devices allowing high-speed operation of the CPU.

Meanwhile, the synchronous semiconductor memory device operates in synchronization with the system clock signal and this system clock signal is changed into an internal clock signal by an internal clock generator in order that an external clock signal from the memory controller is employed in the synchronous semiconductor memory devices. This clock generator, which carries out a relatively stable operation in spite of changes in temperature or voltage etc, may play an important part of the synchronous semiconductor memory devices.

Referring to FIG. 1, a conventional clock generator of a semiconductor memory device includes a clock input unit 2 receiving an external clock signal Clock and a reference voltage Vref and a clock driver unit 4 receiving a clock signal Clkp2 from the clock input unit 2 and outputting an internal clock signal Clkp4. As with the general synchronous apparatus, the synchronous semiconductor memory device operates on a reference pulse. Here, the internal clock signal Clkp4 is used as the reference pulse associated with the production of employed signals and the control thereof.

The detailed circuit diagram of the clock input unit 2 is shown in FIG. 2. The clock input unit 2 includes a differential amplifier 12 to amplify a difference between the external clock signal Clock and the reference voltage Vref. The amplified voltage signal (clock signal Clkp0) from the differential amplifier 12 is delayed in a delay unit 14. A NAND gate 16 receives both the delayed signal and the amplified voltage signal Clkp0, and then the clock signal Clkp2 is finally produced in an inverter 18. The delay unit 14 determines the pulse width of the clock signal Clkp2.

The detailed configuration of the clock driver unit 4 of FIG. 1 is shown in FIG. 3. Referring to FIG. 3, the clock driver 4 includes two CMOS inverters 22 and 24 and a feedback loop, which comprises a delay unit 26, inverters 28 and 30 and PMOS and NMOS transistors 32 and 34 respectively connected to the output terminals of the CMOS inverters 22 and 24. Since the feedback loop is connected to the output terminals of each of the CMOS inverters 22 and 24, the clock driver unit 4 may have different drivabilities depending on the voltage levels of the output internal clock signal Clkp4. The delay width of the delay unit 26 is determined by an amount of delay in the delay unit 14 in the clock input unit 2 where the delay units 14 and 26 may have the same delay time.

Referring to FIGS. 2 and 3, the differential amplifier 12 generates the second clock signal Clkp0 when the external clock signal Clock is inputted into the clock input unit 2. The second clock signal Clkp0 is delayed in the delay unit 14 having a predetermined delay value and then the clock signal Clkp2 is produced via the NAND gate 16 and the inverter 18. Next, the clock signal Clkp2 is amplified by the clock driver unit 4 having the two CMOS inverters 22 and 24 to produce the final internal clock signal Clkp4. The pulse width of the clock signal Clkp4 is determined by the delay unit 26 of the feedback loop.

However, there is a problem in that the delay and the pulse width of the clock signal Clkp4 are unstable, which in turn cause the control and other signals generated by the clock signal Clkp4 to be unstable. That is, referring to FIG. 4, as the supply voltage is changed into 4.0V, 3.0V, 2.5V or 2.0V, the delayed value and the pulse width are considerably changed. Moreover, variation in the delayed value and the pulse width becomes more sensitive with changes in temperature and process variables.

This instability caused by the clock signal Clkp4, destabilize other control signals and circuits, making it difficult to provide an appropriate timing margin for the internal circuits.

SUMMARY OF THE INVENTION

It is, therefore, an object of the present invention to provide a clock generator to produce internal clock signals with a controlled pulse width.

It is another object of the present invention to provide a clock generator producing stable pulse signal even if there is a variation in voltage, temperature and process.

In accordance with an aspect of the present invention, there is a clock generating circuit in a semiconductor device comprising: clock input means for receiving an external clock signal, a reference voltage signal and an option signal, and for outputting first and second clock signals; clock driving means for receiving the first clock signal from the clock input means and for outputting an internal clock signal in response to the option signal; and a detecting means for receiving the second clock signal from the clock input means and for outputting the option signal in response to a control signal.

In accordance with another aspect of the present invention, there is a clock generating circuit in a semiconductor device comprising: clock input means for receiving an external clock signal, a reference voltage signal and an option signal, and for outputting first and second clock signals; clock driving means for receiving the first clock signal and outputting an internal clock signal in response to the option signal; a detecting means for receiving the second clock signal and outputting the option signal in response to a control signal; and means for outputting the control signal to determine operation of the clock generating circuit in response to command signal from a system controller.

In accordance with still another aspect of the present invention, there is a clock generating circuit in a semiconductor device comprising: clock input means for receiving an external clock signal, a reference voltage signal and an option signal, and for outputting first and second clock signals; clock driving means for receiving the first clock signal and outputting an internal clock signal in response to the option signal; a mode register outputting the control signal in response to a command signal from a system controller; means for producing the option signal to control a pulse width of the internal clock signal, wherein the option signal increases the pulse width of the internal clock signal at high voltages and decreases the pulse width of the internal clock signal at low voltages.

BRIEF DESCRIPTION OF THE DRAWINGS

Other objects and aspects of the present invention will become apparent from the following description of the embodiments with reference to the accompanying drawings, in which.

DETAILED DESCRIPTION OF THE INVENTION

Hereinafter, the present invention will be described in detail with reference to the accompanying drawings.

Figure 1:
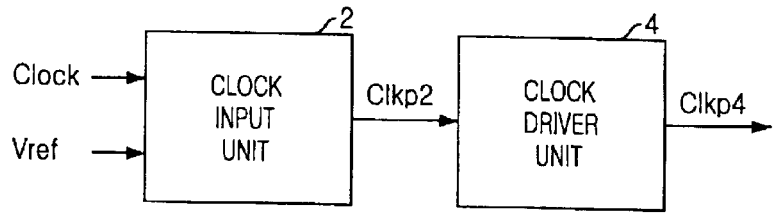
FIG. 1 is a block diagram illustrating a conventional clock generator.
Figure 2:
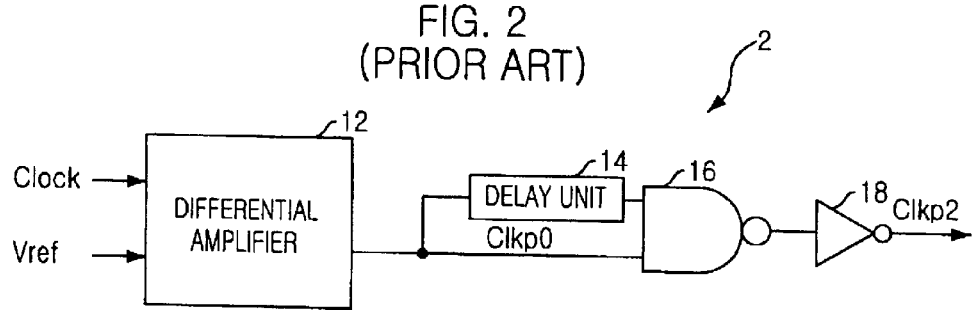
FIG. 2 is a circuit diagram illustrating a clock input circuit of FIG. 1.
Figure 3:
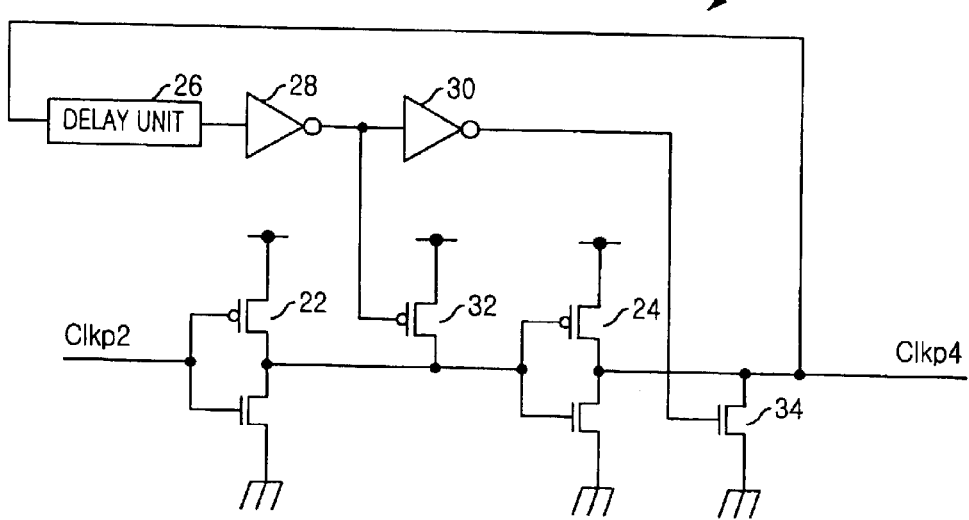
FIG. 3 is a circuit diagram illustrating a clock driver unit of FIG. 1.
Figure 4:
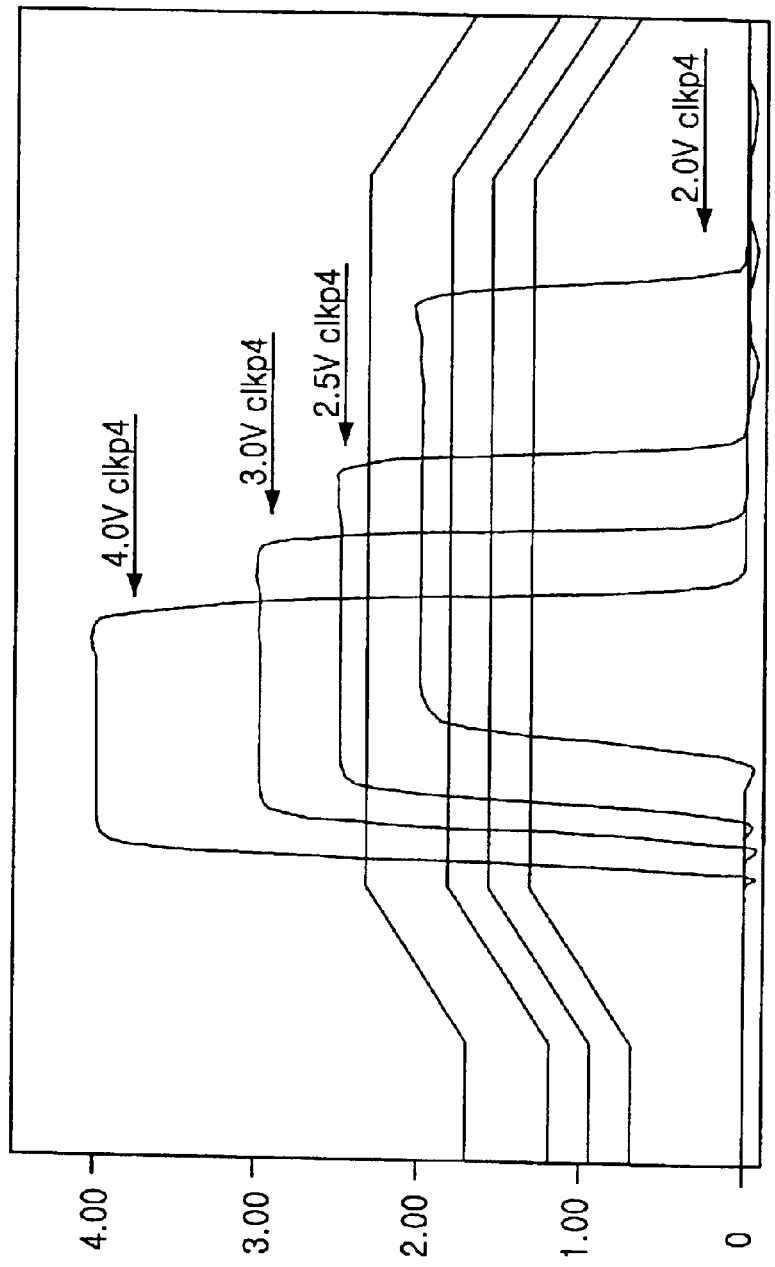
FIG. 4 is a waveform diagram of the conventional clock generator of FIG. 1.
Figure 5:
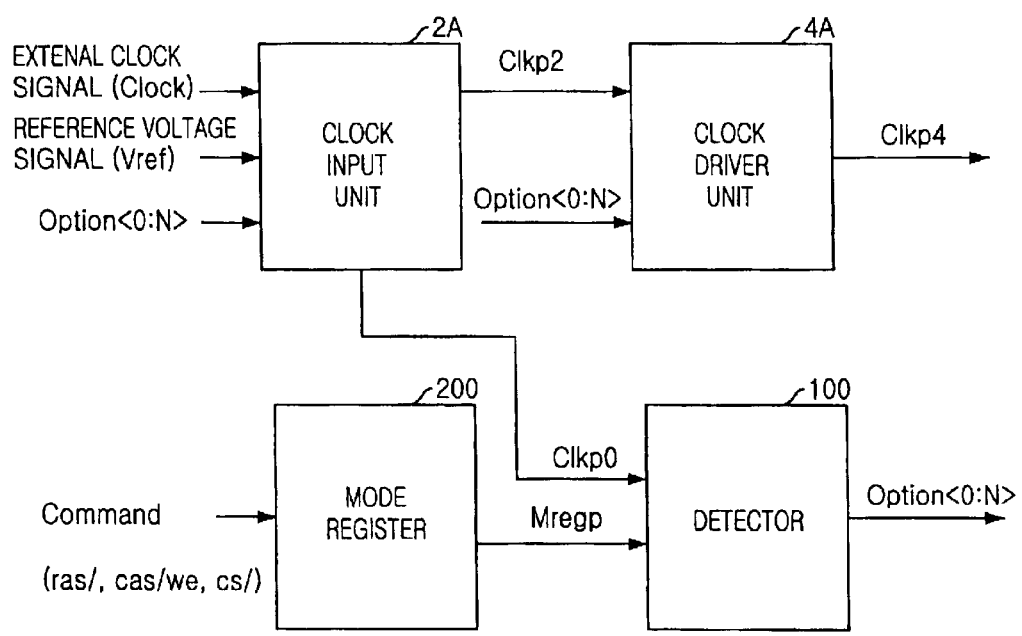
FIG. 5 is a block diagram illustrating a clock generator in accordance with the present invention.

Referring to FIG. 5, a clock generator according to the present invention includes a clock input unit 2A having a differential amplifier, a clock driver 4A, a mode register 200 and a detector 100. The clock input unit 2A receives an external clock signal Clock and a reference voltage signal Vref, outputs a first clock signal Clkp2 in response to an option signal <0:N>, and also outputs a second clock signal Clkp0. The first clock signal Clkp2 lags behind the second clock signal Clkp0 in phase because the first clock signal Clkp2 is outputted via a delay element. The clock driver unit 4A receives the first clock signal Clkp2 and produces an internal clock signal Clkp4 in response to option signals <0:N>. The mode register 200 outputs a control signal Mregp from a combination of command signals, such as RAS, CAS, WE and CS. The option signals <0:N> are produced by the detector 100 receiving the second clock signal Clkp0 and the control signal Mregp from the mode register 200.

The detector 100 detects a variation caused by voltage, temperature and manufacturing process. The detector 100 is controlled by the mode register 200 such that the circuit may operate for a predetermined time with less power consumption. Since the mode register 200 has been well known to those skilled in synchronization memory device, the detailed description of it will be omitted.

Although the clock generator as shown in FIG. 5 makes the internal clock signal Clkp4 using the external clock signal, this internal clock signal is further controlled by the detector 100 to compensate for the variation in voltage, temperature and manufacturing process. Accordingly, delay time and pulse width of the internal clock signal are constantly controlled regardless of the variation in voltage, temperature and manufacturing process.

Figure 6:
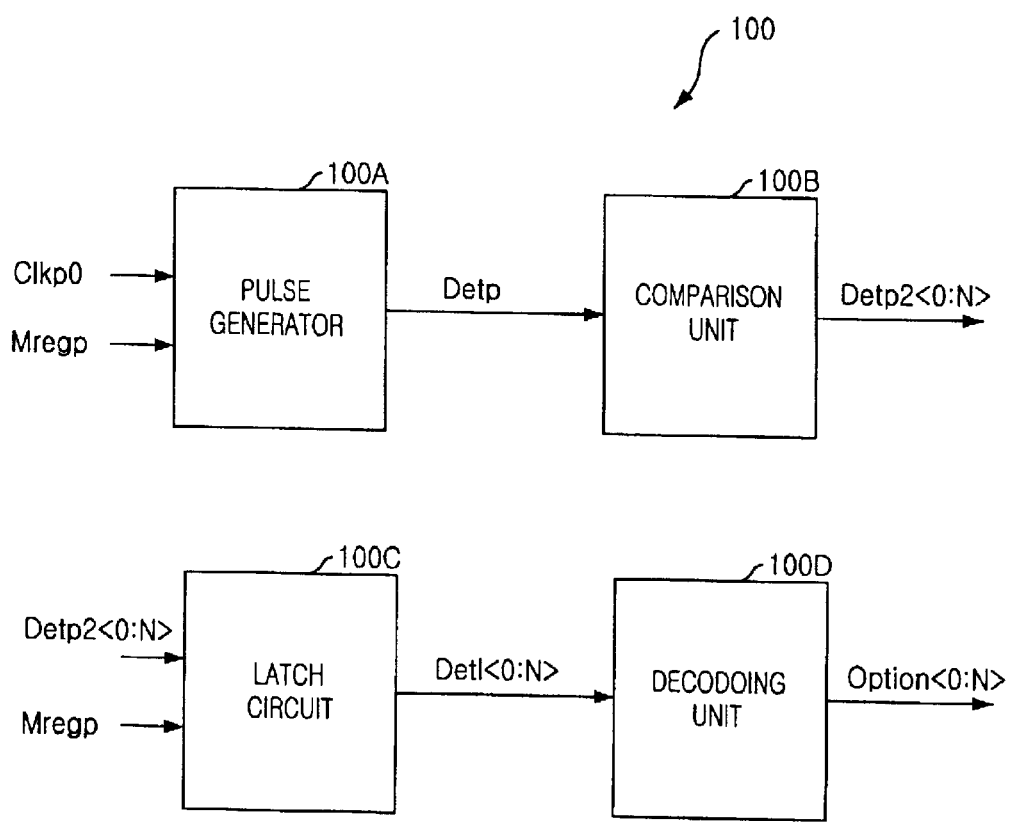
FIG. 6 is a circuit diagram illustrating a detector of FIG. 5.

Referring to FIG. 6, the detector 100 includes a pulse generator 100A, a comparison unit 100B, a latch circuit 100C and a decoding unit 100D. The pulse generator 100A receives the second clock signal Clkp0 from the clock input unit 2A and the control signal Mregp from the mode register 200 and outputs a first detection signal Detp. The comparison unit 100B receives the first detection signal Detp and outputs second detection signals Detp2 <0:N>. The latch circuit 100C receives the second detection signals Detp2<0:N> and the control signal Mregp and outputs third detection signals Det1<0:N>. The decoding unit 100D receives an output signal from the latch circuit 100C and outputs the option signals Option<0:N>.

The pulse generator 100A detects the variation in voltage, temperature and manufacturing process and generates a pulse according to the variation. The comparison unit 100B receiving the first detection signal Detp produces the second detection signals Detp2 <0:N> according to the variation in voltage, temperature and manufacturing process. The latch circuit 100C stores the second detection signals Detp2 <0:N> for a predetermined time (which is determined by the control signal Mregp from the mode register 200). Finally, the decoding unit 100D produces the option signals Option<0:N> using the third detection signals Det1<0:N> outputted by the latch circuit 100C.

Figure 7:
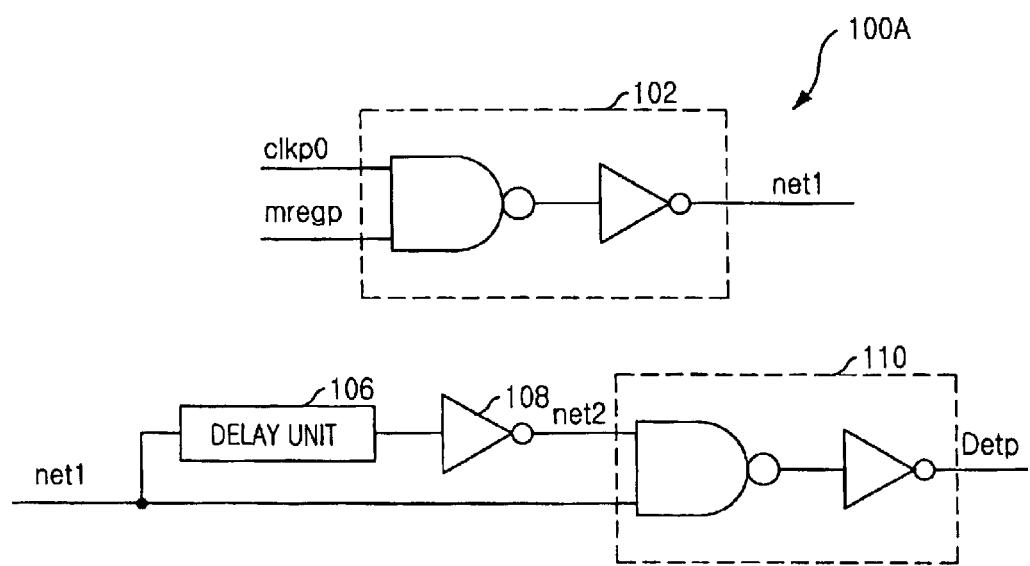
FIG. 7 is a circuit diagram illustrating a detection pulse generator of FIG. 6.

Referring to FIG. 7, the pulse generator 100A includes an input unit 102, which receives the second clock signal Clkp0 and the control signal Mregp and decodes these signals in order to produce an output signal net1. The pulse generator 100A also includes a delay unit 106 to delay the output signal from the input unit 102 and an output unit 110 to output the first detection signal Detp by receiving the output signal net1 and the inverted signal net2 which is produced by inverting the output signal from the delay unit 106 via an inverter 108.

The pulse generator 100A receives an output signal of the differential amplifier in the clock input unit 2A, which is the second clock signal Clkp0 (logic high-pulse enable signal), and the pulse generator 100A then produces the output signal net1 of a logic high pulse while the control signal Mregp is in a logic high level. The output signal net2 of the inverter 108 and the output signal net1 of the input unit 102 are out of phase. This operation can be illustrated on the basis of voltage level. For example, the delay time from the output signal net1 to the output signal net2 is small at the voltage of 4.0V because the delay unit 106 having an inverter chain operates swiftly at high voltage (i.e., 4.0V). Accordingly, the pulse width of the first detection signal Detp becomes narrow. On the contrary, the delay is increased at 2.0V because the signal pass time through the inverter chain of the delay unit 106 is relatively slow at such a low voltage. In this case, the pulse width of the first detection signal Detp is enlarged. In the embodiment of the present invention, the delay unit 106 is made up of ten inverters, connected in series. The greater the variation in voltage, temperature and manufacturing process, the larger the pulse width of the first detection signal Detp. Further, the larger the pulse width of the first detection signal Detp, the easier the comparison unit 100B operates. The use of the control signal Mregp is to reduce the power consumption by operating the pulse generator 100A for only a predetermined amount of time.

Figure 8:
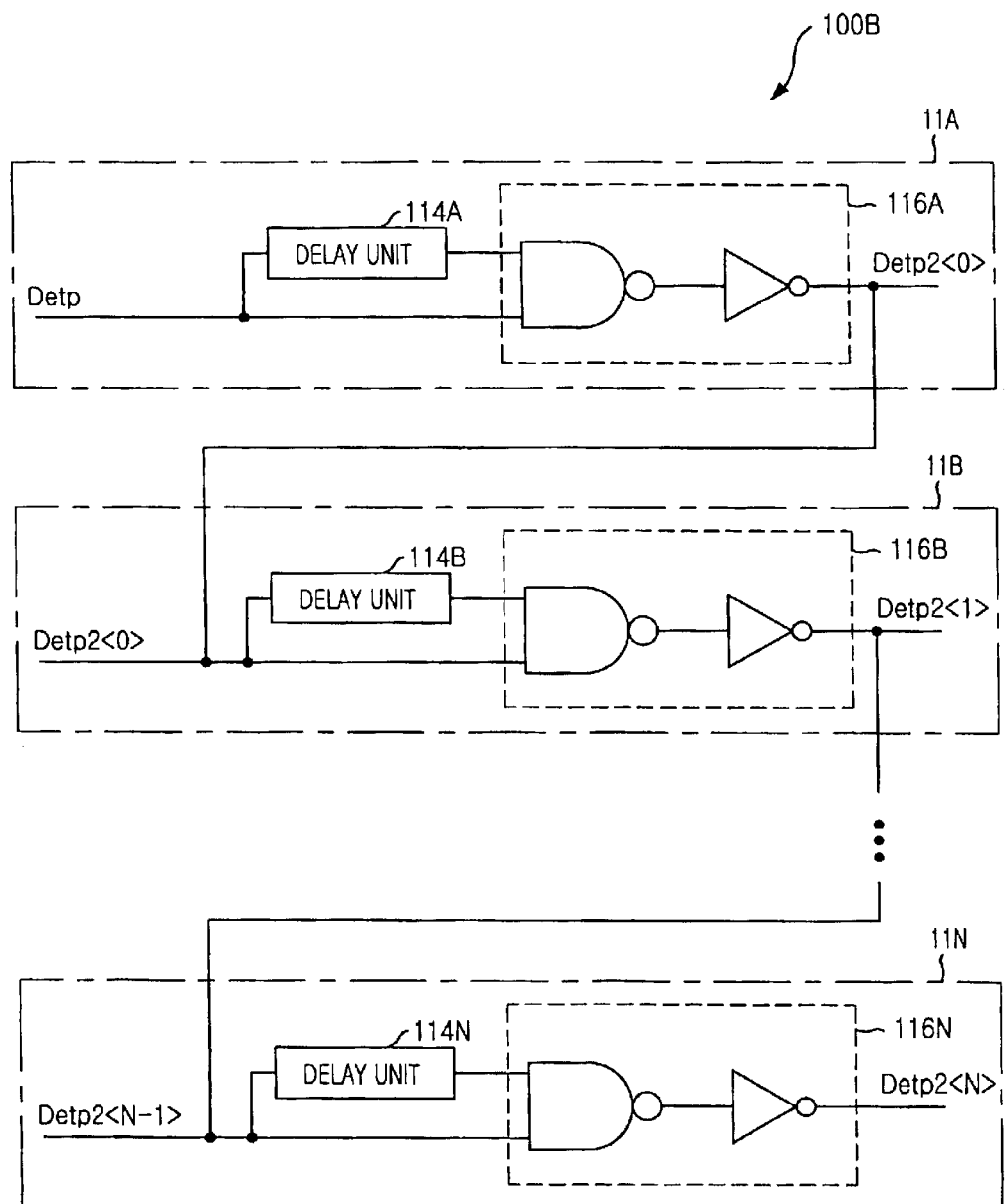
FIG. 8 is a circuit diagram illustrating a detection comparator of FIG. 6.

Referring to FIG. 8, the comparison unit 100B receiving the first detection signal Detp includes a plurality of stages 11A to 11N, connected in series. The stages 11B to 11N receive the output signals from the previous stage as an input signal and output second detection signals Detp2<0> to Detp2<N>, respectively. Also, the stages 11A to 11N include delay units 114A to 114N and decoding units 116A to 116N, respectively. When the voltage is high, the pulse width of the first detection signal Detp is narrow. Further, the pulse width of the second detection signal Detp2<0> becomes narrower than that of the first detection signal Detp. Accordingly, for high voltages, only a few stages 11A to 11N make pulse signals.

On the other hand, for low voltages, the pulse widths of the second detection signals Detp2<0> to Detp<N> are wide. At the same time, the second detection signals Detp2<0:N> have narrower pulse widths than that of the first detection signal Detp, but wider pulse widths than in the case of high voltage. Accordingly, the pulse signals are produced in relatively many stages. For example, when the delay unit is made up of two inverters, the second detection signals Detp2<0> and Detp2<1> are enabled at high voltage and the second detection signal Detp2<2> is disabled. However, at a low voltage, the second detection signals Detp2<0> to Detp2<3> are enabled and other signals over the second detection signal Detp2<4> are disabled. Of course, the voltage is maintained at a constant voltage level, which does not vary with external environment. Even if the number of enabled or disabled signals is dependent on various conditions, there is a difference between the enabled or disabled signals in number.

In FIG. 8, the delay units 114A to 114N should be made of circuits that constantly operate regardless of the variation in voltage, temperature and manufacturing process because a lot of the detection signals Detp2<0:N> should be enabled at low voltages; otherwise, more second detection signals Detp2<0:N> may be enabled due to the shorter delay time when a high voltage is applied, if the operation of the delay units 114A and 114N depend on the variation in voltage, temperature and manufacturing process.

Figure 9:
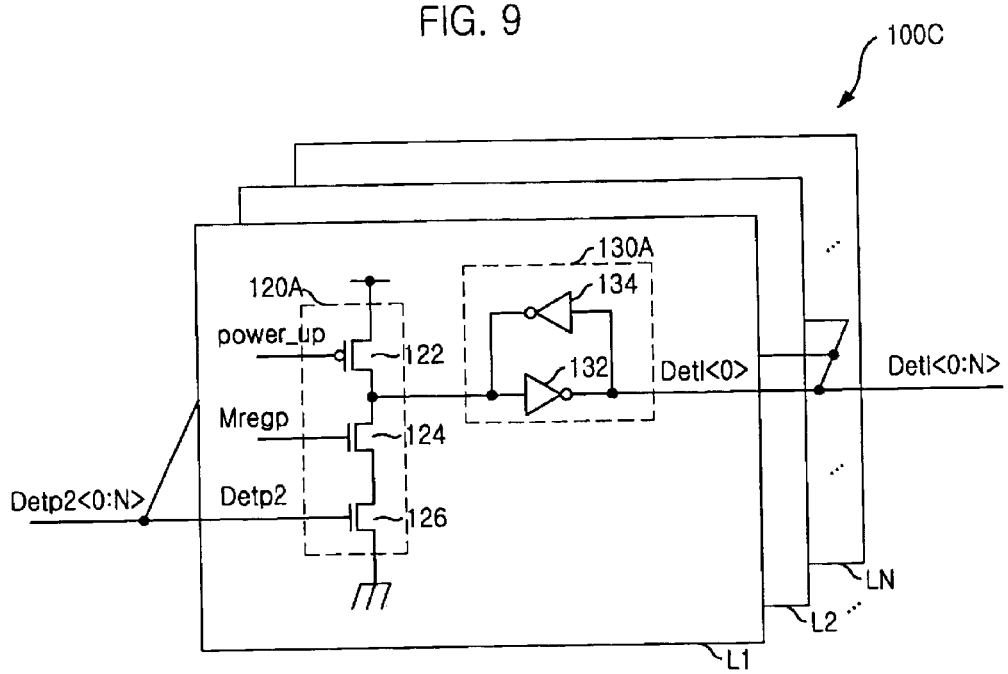
FIG. 9 is a circuit diagram illustrating a detection latch of FIG. 6.

Referring to FIG. 9, the latch circuit 100C used to produce the third detection signals Det1<0:N> includes a plurality of latches L1 to LN where the number of the latches L1 to LN is the same as that of the second detection signals Detp2<0:N>. Each of the latches L1 to LN includes an input buffer 120A, which produces an output signal in response to the second detection signals Detp2<0:N>, the control signal Mregp and a power-up signal power_up, and a unit latch 130A having inverters 132 and 134. In the input buffer 120A, the power-up signal power_up connected to a pull-up transistor 122 initializes the input terminal of the unit latch 130A. The control signal Mregp connected to a pull-down transistor 124 determines the operation time of the latches L1 to LN in order to prevent an erroneous output. The second detection signal Detp2 connected to anther pull-down transistor 126 provides information about variation in voltage, temperature and manufacturing process to latch L1.

The decoding unit 100D in FIG. 6 decodes the third detection signals Det1<0:N> to make the option signals <0:N>. When the first detection signal Detp<0> is enabled and the first detection signal Detp<1> is disabled, the decoding unit 100D enables the option signal <0>. When the first detection signals Detp<0> and Detp<1> are enabled and the first detection signal Detp<2> is disabled, the decoding unit 100D enables the option signal <1>.

Figure 10:
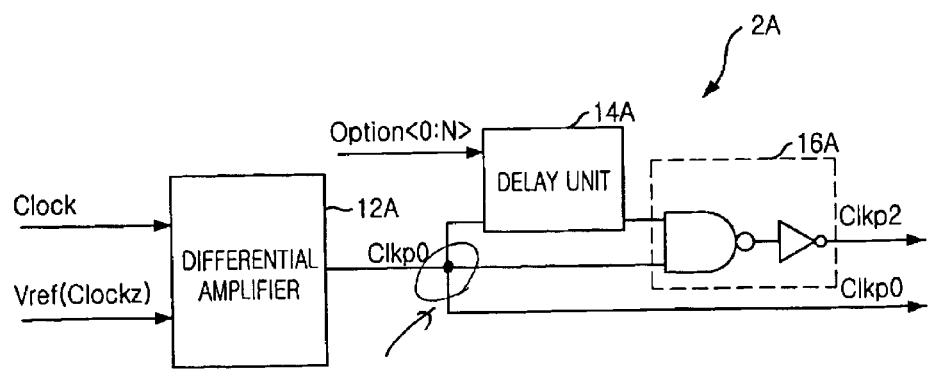
FIG. 10 is a circuit diagram illustrating a clock input unit of FIG. 5.

Referring to FIG. 10, the clock input unit 2A includes a differential amplifier 12A, a delay unit 14A and a decoding unit 16A. The differential amplifier 12A amplifies a voltage difference between the external clock signal Clock and a reference voltage signal Vref, thereby forming the second clock signal Clkp0. The delay unit 14A delays the second clock signal Clkp0 from the differential amplifier 12A in response to the option signals <0:N> and the decoding unit 16A, which has an NAND gate and an inverter, receives the second clock signal Clkp0 and the delayed signal from the delay unit 14A and outputs the first detection signal Clkp2.

Figure 11:
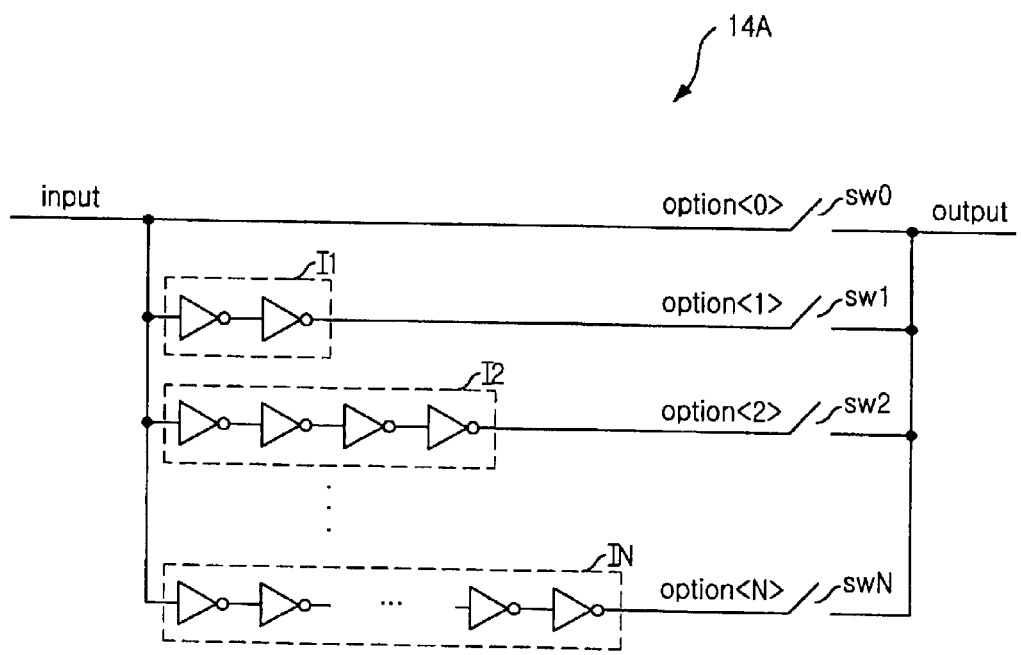
FIG. 11 is a circuit diagram illustrating a delay unit in accordance with the present invention.

The detailed configuration of the delay unit 14A is shown in FIG. 11. As shown in FIG. 11, the delay unit 14A has a plurality of delayers I1 to IN which are connected in parallel to each other. These delayers I1 to IN are selectively connected to its output terminal through switches sw0 to swN in response to the option signals <0:N>. Since the delayers I1 to IN have different delay times, it is possible to produce different output signals in response to the option signals <0:N>. For example, switch sw0 is turned on in response to the option signal <0> at a high voltage so that there is almost no delay time. Also, at a low voltage, switch swN is turned on in response to the option signal <N> with maximum delay.

Figure 12:
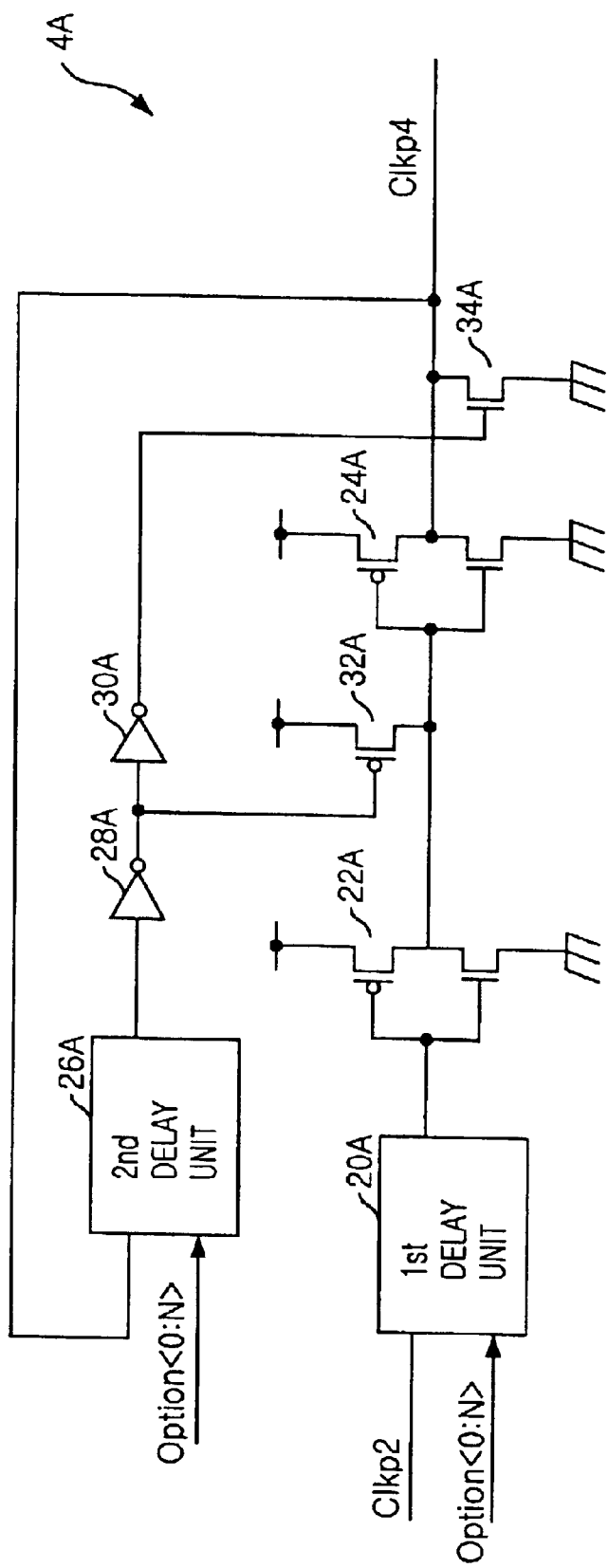
FIG. 12 is a circuit diagram illustrating a clock driver unit of FIG. 5.

Referring to FIG. 12, the clock driver 4A includes first and second delay units 20A and 26A, respectively. The first delay unit 20A delays the first clock signal Clkp2 in response to the option signals <0:N> and drivers 22A and 24A, which are made up of CMOS inverters, are driven by the delayed signal from the delay unit 20A in order to produce the internal clock signal Clkp4. The second delay unit 26A is connected to a feedback loop to delay the internal clock signal Clkp4 in response to the option signals <0:N> and to stabilize the output nodes of the drivers 22A and 24A. Once the internal clock signal Clkp4 is produced, the second delay unit 26A provides an inverted delay signal to an inverter 28A in response to the option signals <0:N> and the inverter 30A inverts the output signal from the inverter 28A. A PMOS pull-up transistor 32A connected between a power supply and an output terminal of the driver 22A provides a voltage level to the input terminal of the driver 24A. Also, an NMOS pull-down transistor 34A connected between a ground voltage level and an output terminal of the driver 24A bypasses the output voltage (the internal clock signal Clkp4) to the ground voltage level. Accordingly, after the final signal is outputted from the output terminal of the driver 24A, an inverted clock signal is outputted in response to the option signals <0:N>.

In FIG. 12, the option signals <0:N> are used to control the voltage variation in the first delay unit 20A. To control the pulse width of the internal clock signal Clkp4, the option signals <0:N> are inputted to the second delay unit 26A through the feedback loop.

Figure 13:
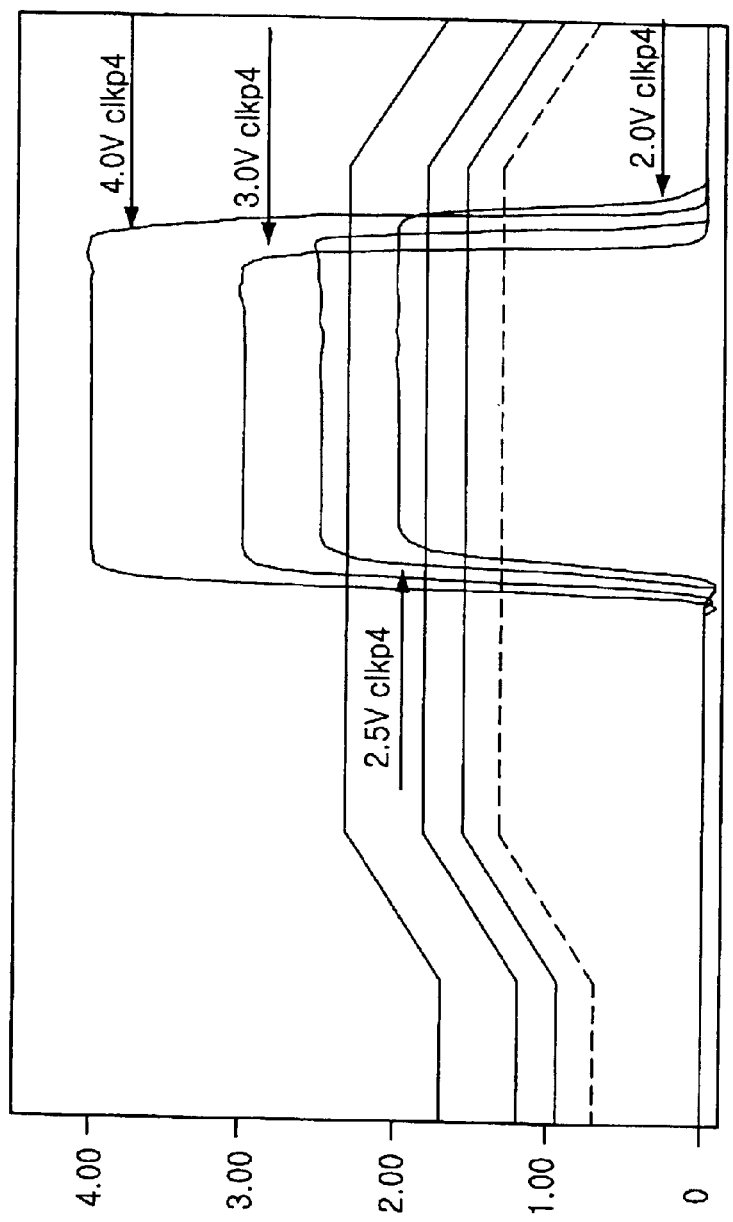
FIG. 13 is a waveform diagram of the clock generator of FIG. 5.

FIG. 13 is a waveform of the clock generator shown in FIG. 5. While the voltage levels are varied, the pulse width and the delay time of the internal clock signal Clkp4 are maintained at a constant value without fluctuation. That is, the detector 100 contributes a stable pulse signal to logic devices or memory devices requiring a pulse signals, by producing option signals to control the variation in the internal clock signal. In case of a high voltage level, the detector 100 increases the pulse width by increasing the delay time with a low operation speed. On the contrary, in case of a low voltage level, the detector 100 decreases the pulse width by decreasing the delay time with a high operation speed.

As clearly stated above, the clock generating circuit according to the present invention outputs a stable internal clock signal, independent from a variation in voltage, temperature and manufacturing process. Accordingly, the clock generating circuit improves the operation capacity of the logic devices or memory devices and provides an improved control with a stable timing margin.

While the present invention has been described with respect to certain preferred embodiments, it will be apparent to those skilled in art that various changes and modifications may be made without departing from the scope of the invention as defined in the following claims.

What is claimed is:

1. A clock generating circuit in a semiconductor device comprising:
   clock input means for receiving an external clock signal, a reference voltage signal and an option signal, and for outputting first and second clock signals;
   clock driving means for receiving the first clock signal from the clock input means and for outputting an internal clock signal in response to the option signal; and
   a detecting means for receiving the second clock signal from the clock input means and for outputting the option signal to maintain a pulse width of the internal clock signal at a stable value without much fluctuation to the clock input means and the clock driving means in response to a control signal.

2. The clock generating circuit as recited in claim 1, further comprising a mode register to produce the control signal using by combining command signals from a system controller.

3. The clock generating circuit as recited in claim 1, wherein the clock input means includes:
   an input unit for receiving the external clock signal and the reference voltage signal, and for outputting the second clock signal;
   a delay unit for delaying the second clock signal in response to the option signal; and
   a decoding unit for receiving an output signal from the delay unit and the second clock signal, and for outputting the first clock signal.

4. The clock generating circuit as recited in claim 3, wherein the input unit is a differential amplifier to amplify a difference between the external clock signal and the reference voltage signal.

5. The clock generating circuit as recited in claim 3, wherein the delay unit includes:
   a plurality of delayers connected in parallel between input and output terminals of the delay unit; and
   a plurality of switches for selectively connecting the delayers to the output terminals of the delay unit delay in response to the option signal so that the delay unit determines an amount of delay.

6. The clock generating circuit as recited in claim 1, wherein the clock driving means includes:
   a first delay unit for delaying the first clock signal from the clock input means in response to the option signal;
   a driver for amplifying an output signal of the first delay unit; and
   a feedback loop for controlling an output signal from the clock driving means in response to the option signal.

7. The clock generating circuit as recited in claim 6, wherein the first delay unit includes:
   a plurality of delay blocks connected in parallel, wherein each of the plurality of delay blocks has different delay time to delay the first clock signal; and
   a plurality of switches for selecting the delay time of the first clock signal in response to the option signal.

8. The clock generating circuit as recited in claim 6, wherein the driver includes:
   a first CMOS inverter for receiving an output signal from the delay unit; and
   a second CMOS inverter for receiving an output signal from the first CMOS inverter to produce the internal clock signal.

9. The clock generating circuit as recited in claim 8, wherein the feedback loop includes:
   a second delay unit for delaying the internal clock signal in response to the option signal; and
   a control means for controlling output terminals of the first and second CMOS inverters.

10. The clock generating circuit as recited in claim 9, wherein the second delay unit includes:
    a plurality of delay blocks connected in parallel, wherein each of the delay blocks has different delay time to delay the internal clock signal; and
    a plurality of switches for selecting the delay time of the internal clock signal in response to the option signal.

11. The clock generating circuit as recited in claim 1, wherein the detecting means includes:
    a pulse generator for receiving the second clock signal in response to the control signal in order to produce the first detection signal;
    a comparison unit for receiving the first detection signal in order to produce a second detection signal which has a different pulse width from the first detection signal;
    a latch circuit for latching the second detection signal in response to the option signal in order to produce third detection signals; and
    a decoding unit for receiving the third detection signals from the latch circuit in order to produce the option signal.

12. The clock generating circuit as recited in claim 11, wherein the pulse generator includes:
    a first decoder for receiving the second clock signal and the control signal;
    a delay unit for delaying an output signal from the first decoder; and
    a second decoder for receiving the output signals from the first decoder and the delay unit in order to produce the first detection signal.

13. The clock generating circuit as recited in claim 11, wherein the comparison unit includes a plurality of comparison stages connected in series, wherein each comparison stage receives an output signal from the previous stage as an input signal and outputs the second detection signal and wherein each comparison stage includes:

a delayer for delaying the output signal from the previous stage; and a decoder for receiving the output signal from the previous stage and an output signal from the delayer in order to produce the second detection signal.

14. The clock generating circuit as recited in claim 11, wherein the latch circuit includes a plurality of unit latches, wherein the unit latches are the same as the second detection signals in number and wherein the unit latch includes pull-up and pull-down means for outputting a voltage level in response to a power-up signal, the control signal and the second detection signal.

15. A clock generating circuit in a semiconductor device comprising:

clock input means for receiving an external clock signal, a reference voltage signal and an option signal, and for outputting first and second clock signals;

clock driving means for receiving the first clock signal from the clock input means and for outputting an internal clock signal in response to the option signal;

a detecting means for receiving the second clock signal from the clock input means and for outputting the option signal to maintain a pulse width of the internal clock signal at a stable value without much fluctuation to the clock input means and the clock driving means in response to a control signal; and means for outputting the control signal to determine operation of the clock generating circuit in response to command signal from a system controller.

16. The clock generating circuit as recited in claim 15, wherein the detecting means includes:

a pulse generator for receiving the second clock signal in response to the control signal in order to produce a first detection signal;

a comparison unit for receiving the first detection signal in order to produce a second detection signal which has a different pulse width from the first detection signal;

a latch circuit for latching the second detection signal in response to the option signal in order to produce third detection signals; and a decoding unit for receiving the third detection signals from the latch circuit in order to produce the option signal.

17. A clock generating circuit in a semiconductor device comprising:

clock input means for receiving an external clock signal, a reference voltage signal and an option signal, and for outputting first and second clock signals;

clock driving means for receiving the first clock signal and outputting an internal clock signal in response to the option signal;

a mode register outputting the control signal in response to a command signal from a system controller; and means for producing the option signal to maintain a pulse width of the internal clock signal at a stable value without much fluctuation.

* * * * *